US012656400B2

(12) United States Patent (10) Patent No.: US 12,656,400 B2

Gao et al. (45) Date of Patent: Jun. 16, 2026

(54) BATTERY REAL-TIME INTERNAL SHORT CIRCUIT DETECTION

(71) Applicant: The Boeing Company, Chicago, IL (US)

(72) Inventors: Lijun Gao, Renton, WA (US); Shengyi Liu, Seattle, WA (US); Glen M. Brown, Woodinville, WA (US)

(73) Assignee: The Boeing Company, Arlington, VA (US)

( * ) Notice: Subject to any disclaimer, the term of this patent is extended or adjusted under 35 U.S.C. 154(b) by 412 days.

(21) Appl. No.: 18/213,786

(22) Filed: Jun. 23, 2023

(65) Prior Publication Data

US 2024/0426919 A1 Dec. 26, 2024

(51) Int. Cl.
*G01R 31/367* (2019.01)
*G01R 31/3828* (2019.01)
*G01R 31/396* (2019.01)

(52) U.S. Cl.
CPC ....... *G01R 31/367* (2019.01); *G01R 31/3828* (2019.01); *G01R 31/396* (2019.01)

(58) Field of Classification Search
CPC .......................... G01R 31/367; G01R 31/3828; G01R 31/396; G01R 31/3842; G01R 31/392; G01R 31/52; G01R 31/385; G01R 1/0416; G01R 31/378

See application file for complete search history.

(56) References Cited

U.S. PATENT DOCUMENTS

| | | | | |
|---|---|---|---|---|
| 5,278,748 | A | * | 1/1994 | Kitajima ........... H02M 3/33592 |
| | | | | 363/21.02 |
| 6,028,413 | A | * | 2/2000 | Brockmann ............ H02J 50/60 |
| | | | | 320/108 |
| 11,038,421 | B2 | * | 6/2021 | LaBella ................. H02M 3/158 |
| 11,368,031 | B2 | * | 6/2022 | Qian ...................... H02J 7/1423 |
| 11,611,282 | B2 | * | 3/2023 | Deng ................ H02M 3/33569 |
| 2008/0094042 | A1 | * | 4/2008 | Ferrario .................... H02J 7/00 |
| | | | | 323/234 |

(Continued)

FOREIGN PATENT DOCUMENTS

| | | |
|---|---|---|
| CN | 112946522 A | 6/2021 |
| CN | 114910802 A | 8/2022 |

OTHER PUBLICATIONS

European Patent Office, Extended European Search Report and Written Opinion in App. No. EP24178244, Oct. 24, 2024.

*Primary Examiner* — Tung S Lau

(74) *Attorney, Agent, or Firm* — Kolitch Romano Dascenzo Gates LLP

(57) ABSTRACT

A system may include a battery and a processor configured to continuously record a voltage and current as a function of time. A time window may be determined based on the current as a function of time. During the time window, an accumulated electric charge may be substantially zero and an accumulated absolute value of the electric charge may substantially equal a stored comparison value. The processor may calculate an energy loss of the battery and a charge loss rate of the battery within the time window. The processor may further determine whether an internal short circuit exists within the battery based on the charge loss rate and a predetermined threshold value. In response to determining that the internal short circuit exists, the processor may generate an indication that the internal short circuit exists.

20 Claims, 6 Drawing Sheets

(56) References Cited

U.S. PATENT DOCUMENTS

| | | | |
|---|---|---|---|
| 2016/0103188 A1 | 4/2016 | Eifert et al. | |
| 2017/0179810 A1* | 6/2017 | Ryan | H02M 3/33507 |
| 2019/0067958 A1* | 2/2019 | Zimnicki | H03F 3/185 |
| 2021/0194377 A1* | 6/2021 | Deng | H02M 1/4241 |
| 2022/0283237 A1 | 9/2022 | Kondo | |

* cited by examiner

600

700

$800$ $802$ — Input $C_w$, R, M & $\delta$ $804$ — Measure $v(t)$ and $i(t)$, log the data into storage $806$ — Search and determine a dynamic time window $808$ — Calculate an energy loss in the time window $810$ — Calculate an internal charge loss rate CLR $812$ — Calculate an average internal charge loss rate $CLR_{avg}$ $814$ — $|CLR - CLR_{avg}| > \delta$    N

Y $816$ — Battery ISC detected

BATTERY REAL-TIME INTERNAL SHORT CIRCUIT DETECTION

FIELD OF THE DISCLOSURE

This disclosure is generally related to the field of short circuit detection and, in particular, to battery real-time internal short circuit detection.

BACKGROUND

An internal short circuit (ISC) may occur within a lithium-ion battery cell due to build-up of a short circuit channel, which may be a result of a lithium-ion dendritic process. The dendritic process may be caused by manufacturing defects, cell deformation by external force, battery abuse, such as fast charging or overcharging, degradation over time, or a combination of each of these factors. An ISC can cause thermal runaway, and even catastrophic failure, with significant economic losses in transportation and other industries.

Off-line detection of ISCs may include interrupting battery operations. For example, systems may be temporarily taken off-line, and, in some cases, the battery may be removed for testing. Thus, these detection methods are not suitable for real-time detection, such as during the operation of a vehicle. Temperature sensing may also provide an indication of an ISC. However, temperature criteria associated with an ISC condition are hard to determine because a temperature rise may result from reasons other than an ISC, such as high current conditions or external cooling of the battery. Also, when an ISC occurs, the temperature may rise very quickly. Therefore, temperature sensing is not a dependable method for early ISC detection. Internal resistance sensing, within the battery may also be considered for the detection of ISC conditions. For example, a battery's internal resistance may become infinitely small when an ISC has been built up. However, a typical battery has internal parameters, such that a resistance calculated based on a voltage and current at the battery terminals may not be consistent with the actual ISC build-up process. Other disadvantages may exist.

SUMMARY

Disclosed is a battery real-time ISC detection system and method that overcomes at least one of the shortcomings described above. In an embodiment, a method includes determining a dynamic time window based on the law of charge conservation, then calculating an internal charge loss rate within the time window based on the law of energy conservation. The internal charge loss rate may be compared with a given threshold to determine if a battery ISC has occurred. Additionally, the internal charge loss rate may be compared to those of previously taken dynamic windows, thus minimizing the effect of measurement error. These operations may enable real-time detection of an ISC without interrupting normal battery operations. As an additional benefit, detection may be made using common battery signals (e.g., voltage and current), which can be measured at the battery terminals. Thus, the disclosed method may be simple and easy to implement as compared to other ISC detection methods.

In an embodiment, a system includes a battery having a set of terminals and one or more processing elements configured to continuously record, at the set of terminals, a voltage as a function of time and a current as a function of time. The one or more processing elements are further configured to determine a time window based on the current as a function of time. During the time window, an accumulated electric charge is substantially zero. Also, during the time window, an accumulated absolute value of the electric charge substantially equals a stored comparison value. The one or more processing elements are also configured to calculate an energy loss of the battery within the time window, calculate a charge loss rate of the battery within the time window based at least partially on the energy loss of the battery within the time window, and determine whether an internal short circuit exists within the battery based on the charge loss rate and a predetermined threshold value. In response to determining that the internal short circuit exists, the one or more processing elements are configured to generate an indication that the internal short circuit exists.

In some embodiments, the one or more processing elements are configured to initiate an automatic shutdown of battery operations associated with the battery, transfer a load to another battery, or both, in response to the indication that the internal short circuit exists. In some embodiments, the one or more processing elements are configured to continually repeat determining additional time windows based on the current as a function of time, continually repeat calculating additional energy losses of the battery within the additional time windows, continually repeat calculating additional charge loss rates of the battery within the additional time windows, and continually repeat determining whether the internal short circuit exists based on the additional charge loss rates of the battery and the predetermined threshold value.

In some embodiments, the one or more processing elements are configured to continually update an average charge loss rate of the battery based on a predetermined number of most recently calculated additional charge loss rates. In some embodiments, the stored comparison value is a rated cell capacity value associated with the battery. In some embodiments, as part of calculating the energy loss of the battery within the time window, the one or more processing elements are configured to calculate a magnitude of energy transferred at the set of terminals during the time window during charging of the battery, calculate a magnitude of energy transferred at the set of terminals during the time window during discharging of the battery, and calculate an internal resistive energy loss at the set of terminals during the time window based on a predetermined resistance of the battery. In some embodiments, the energy loss of the battery within the time window is substantially equal to a difference between the magnitude of the calculated energy transferred during charging of the battery and a combination of the magnitude of the energy transferred during discharging of the battery and the internal resistive energy loss. In some embodiments, the predetermined resistance of the battery is determined from a manufacturer specification or from lab testing.

In some embodiments, as part of calculating the charge loss rate of the battery within the time window, the one or more processing elements are configured to calculate an average battery potential during the time window. In some embodiments, the charge loss rate of the battery is substantially equal to the energy loss of the battery within the time window divided by a product of the average battery potential during the time window and a duration of the time window. In some embodiments, as part of determining whether an internal short circuit exists, the one or more processing elements are configured to calculate an average charge loss rate of the battery based on a predetermined number of most recently calculated charge loss rates, calculate a difference between the charge loss rate of the battery and the average charge loss rate of the battery, and determine whether the difference is greater than the predetermined threshold value. In some embodiments, the battery and the one or more processing elements are incorporated into an aircraft.

In an embodiment, a system includes a processor and memory, where the memory stores instructions that, when executed by the processor, cause the processor to continuously record, at a set of terminals of a battery, a voltage as a function of time and a current as a function of time. The instructions further cause the processor to determine a time window based on the current as a function of time by select a beginning time $T_{start}$ of the time window and an ending time $T_{stop}$ of the time window that substantially satisfy the equations $$0 = \int_{T_{start}}^{T_{stop}} i \cdot dt \text{ and } C_W = \int_{T_{start}}^{T_{stop}} |i| \cdot dt,$$

where i is the current as a function time and where $C_W$ is a stored comparison value. The instructions also cause the processor to calculate an energy loss of the battery within the time window, calculate a charge loss rate of the battery within the time window based at least partially on the energy loss of the battery within the time window, and determine whether an internal short circuit exists within the battery based on the charge loss rate of the battery and a predetermined threshold value. In response to determining that the internal short circuit exists, the instructions cause the processor to generate an indication that an internal short circuit exists.

In some embodiments, the energy loss of the battery within the time window substantially satisfies the equation $$E_2 = \int_{T_{start}}^{T_{stop}} v \cdot |i|_{(i \leq 0)} \cdot dt - \int_{T_{start}}^{T_{stop}} v \cdot |i|_{(i>0)} \cdot dt - \int_{T_{start}}^{T_{stop}} i \cdot i \cdot R \cdot dt,$$

where $E_2$ is the calculated energy loss of the battery, v is the voltage as a function of time, and R is a predetermined resistance of the battery. In some embodiments, the charge loss rate of the battery within the time window substantially satisfies the equation $$CLR = \frac{E_2}{\int_{T_{start}}^{T_{stop}} (v + i \cdot R) dt},$$

where CLR is the charge loss rate of the battery within the time window, $E_2$ is the calculated energy loss of the battery, v is the voltage as a function of time, and R is a predetermined resistance of the battery.

In an embodiment, a method includes continuously recording, at a set of terminals of a battery, a voltage as a function of time and a current as a function of time. The method further includes determining a time window based on the current as a function of time, where, during the time window, an accumulated electric charge is substantially zero, and where, during the time window, an accumulated absolute value of the electric charge substantially equals a stored comparison value. The method also includes calculating an energy loss of the battery within the time window, calculating a charge loss rate of the battery within the time window based at least partially on the energy loss of the battery within the time window, and determining whether an internal short circuit exists within the battery based on the charge loss rate of the battery and a predetermined threshold value. The method includes generating an indication that the internal short circuit exists.

In some embodiments, the method includes initiating an automatic shutdown of battery operations associated with the battery, transfer a load to another battery, or both, in response to the indication that the internal short circuit exists. In some embodiments, the method includes determining additional time windows based on the current as a function of time, calculating additional energy losses of the battery within the additional time windows, calculating additional charge loss rates of the battery within the additional time windows, and determining whether the internal short circuit exists based on the additional charge loss rates of the battery and the predetermined threshold value.

In some embodiments, the method includes calculating a magnitude of energy transferred at the set of terminals during the time window during charging of the battery, calculating a magnitude of energy transferred at the set of terminals during the time window during discharging of the battery, and calculating an internal resistive energy loss at the set of terminals during the time window based on a predetermined resistance of the battery. In some embodiments, the energy loss of the battery within the time window is substantially equal to a difference between the magnitude of the calculated energy transferred during charging of the battery and a combination of the magnitude of the energy transferred during discharging of the battery and the internal resistive energy loss.

In some embodiments, the method includes determining the predetermined resistance of the battery by measurement. In some embodiments, the method includes calculating an average battery potential during the time window, where the charge loss rate of the battery is substantially equal to the energy loss of the battery within the time window divided by a product of the average battery potential during the time window and a duration of the time window. In some embodiments, the method includes calculating a difference between the charge loss rate of the battery and an average charge loss rate of the battery and determining whether the difference is greater than a predetermined threshold value.

Figure 1:
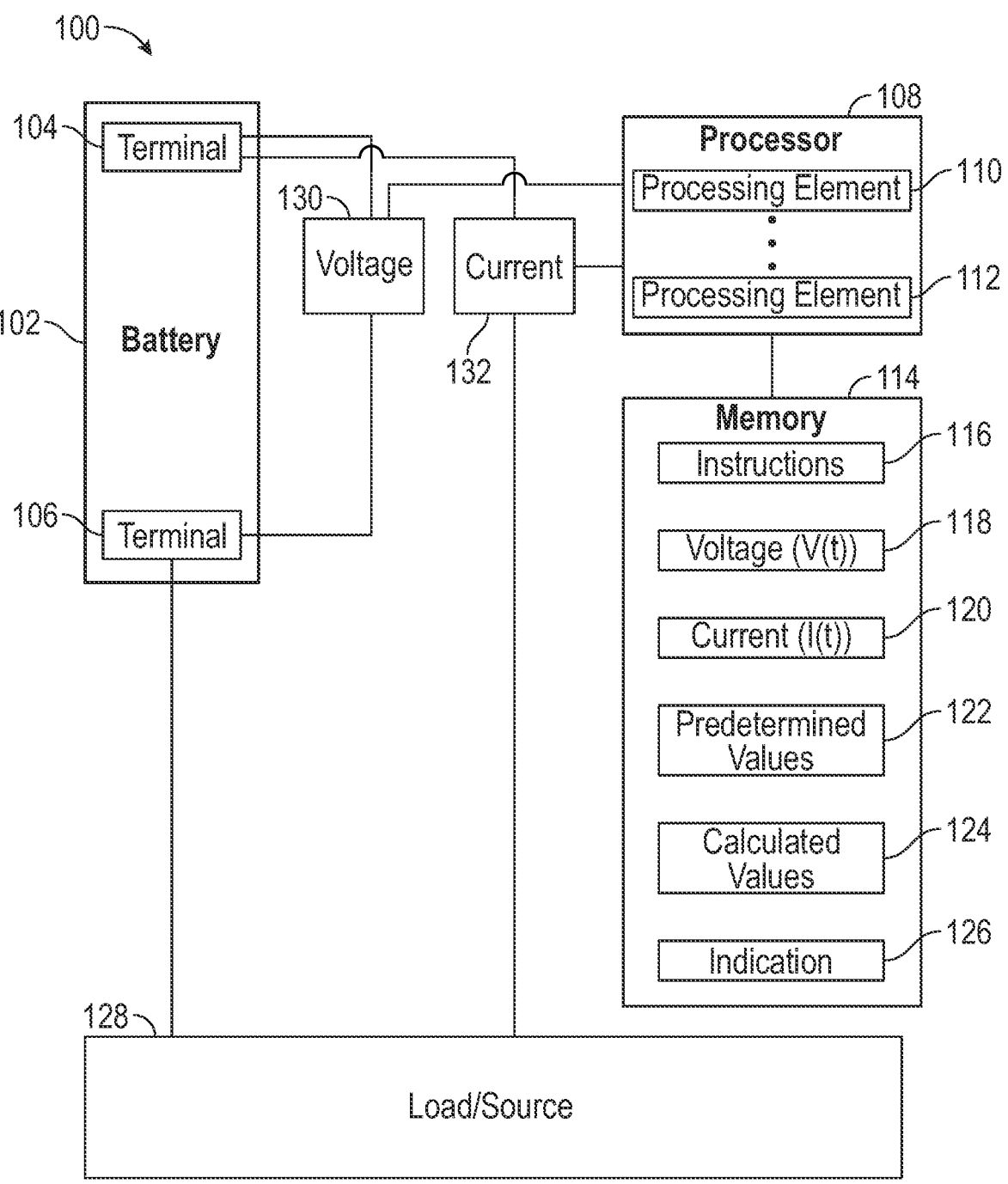
FIG. 1 is a block diagram depicting a battery real-time ISC detection system.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Referring to FIG. 1, a battery real-time ISC detection system 100 is depicted. The system 100 may include a battery 102, a load or source 128, a processor 108, and memory 114. While the description herein is sufficient for illustrating the elements of battery real-time ISC detection, it should be noted that the system 100 may include additional features or elements depending on a particular application of the disclosure.

The battery 102 may include a first terminal 104 and a second terminal 106 as a set. While only two terminals are depicted in the set of terminals 104, 106, it should be understood that a battery may include additional terminals, depending on its internal configuration and applications. A voltage sensor 130 (e.g., a voltmeter) may be connected between the set of terminals 104, 106 to read a voltage therebetween. A current sensor 132 (e.g., an ammeter) may be connected between one of the terminals (e.g., the terminal 104) and the load or source 128 to read a current therebetween. The battery 102 may be coupled to the load or source 128 such that the load or source 128 may draw power from, or provide power to, the battery 102 through the set of terminals 104, 106.

The load or source 128 may include one or more electrical systems that draw power from the battery 102 and one or more electrical sources that provide power to the battery 102. In some cases, the load or source 128 may include low power systems, such as those of portable electronic devices. In other cases, the load or source 128 may include high power systems, such as those used in vehicle (e.g., aircraft) navigation and propulsion, into which the system 100 may be incorporated. Other applications may exist.

The processor 108 may include a central processing unit (CPU), a graphical processing unit (GPU), a digital signal processor (DSP), a peripheral interface controller (PIC), another type of microprocessor or microcontroller, and/or combinations thereof. Further, the processor 108 may be implemented using integrated circuits, field-programmable gate arrays (FPGAs), application-specific integrated circuit (ASICs), combinations of logic gate circuitry, other types of digital or analog electrical design components, or combinations thereof. The processor 108 may include a set of processing elements, such as the processing element 110 and the processing element 112. These processing elements 110, 112 may be packaged together, or located remotely, in a distributed processor configuration.

The voltage sensor 130 and the current sensor 132 may be coupled to the processor 108 to enable the processor 108 to receive data therefrom. Although not shown, additional circuitry and components (e.g., an analog-to-digital converter or the like) may be used to assist with communicating a real-time voltage and current from the set of terminals 104, 106 to the processor 108.

The memory 114 may include memory devices such as random-access memory (RAM), read-only memory (ROM), magnetic disk memory, optical disk memory, flash memory, another type of memory capable of storing data and processor instructions, or the like, or combinations thereof. The memory 114 may store instructions 116 for battery real-time ISC detection as described herein. For example, the instructions 116 may be readable by the processor 108 to perform any of the operations described herein.

The memory 114 may further store logged data associated with the battery 102, such as a voltage 118 as a function of time and a current 120 as a function of time. The voltage 118 and the current 120 may be periodically sampled by the processor 108, using the voltage sensor 130 and the current sensor 132 to create their respective functions. Predetermined values 122 and calculated values 124 may also be stored in the memory 114. These values may be used for battery real-time ISC detection as described herein.

During operation, the voltage sensor 130 may continuously measure a voltage across the set of terminals 104, 106, which may be recorded or logged as the voltage 118 as a function of time. Likewise, the current sensor 132 may continuously measure a current across the set of terminals 104, 106, which may be recorded or logged as the current 120 as a function of time. As described further herein, based on the voltage 118, the current 120, and the predetermined values 122, the calculated values 124 may be generated and, if an ISC is detected, an indication 126 that an ISC exists may be generated.

Figure 2:
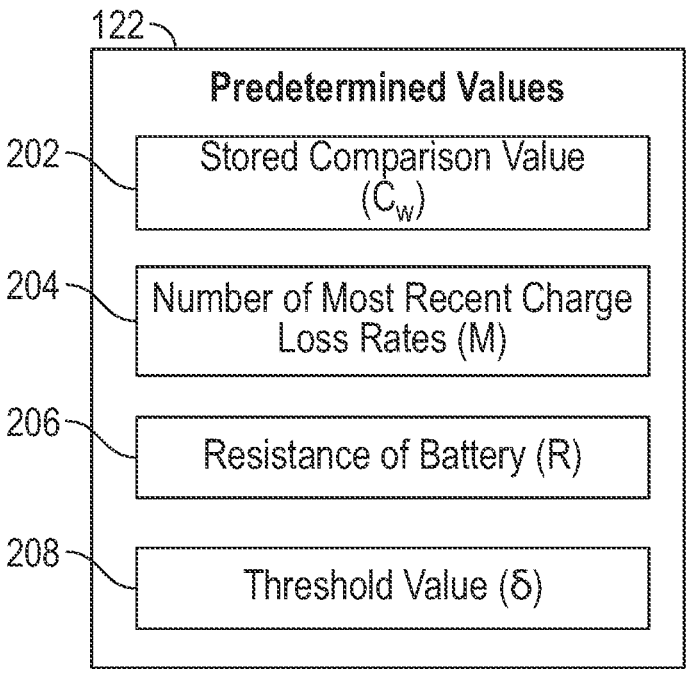
FIG. 2 is a block diagram depicting predetermined values that may be stored in memory at a battery real-time ISC detection system.

The predetermined values 122 may be received based on user input, configuration files, coded definitions, or the like. Referring to FIG. 2, these predetermined values 122 may include a stored comparison value 202, a number of most recent charge loss rates 204, a resistance 206 of the battery 102, and a threshold value 208. Each of the predetermined values 122 may be used at some point during the process of ISC detection.

Figure 3:
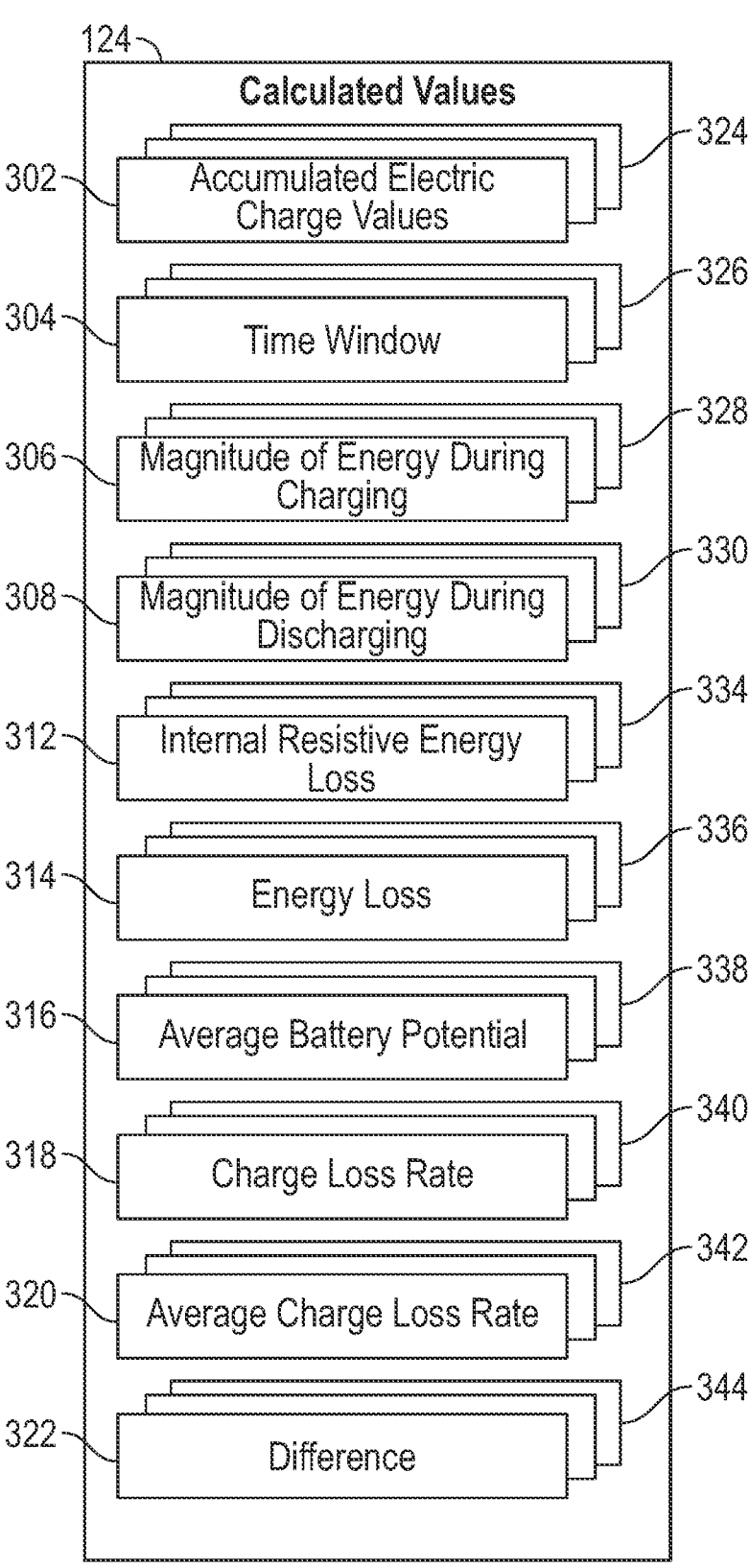
FIG. 3 is a block diagram depicting calculated values that may be calculated by a battery real-time ISC detection system and stored in a memory thereof.

The calculated values 124 may include various intermediate calculations and data for use in determining whether an ISC has occurred. Referring to FIG. 3, the calculated valued 124 may include accumulated electric charge values 302, a time window 304, a magnitude of energy transferred during charging 306, a magnitude of energy transferred during discharging 308, an internal resistive energy loss 312, an energy loss 314, an average battery potential 316, a charge loss rate 318, an average charge loss rate 320, and a difference 322 between the average charge loss rate 320 and the charge loss rate 318. The calculation and usage of these values for detection of an ISC is described further herein. Additionally, because the processes for ISC detection are continuous and in real-time, the processor 108 may continuously calculate and store additional accumulated electric charge values 324, additional time windows 326, additional magnitudes of energy transferred during charging 328, additional magnitudes of energy transferred during discharging 330, additional internal resistive energy losses 334, additional energy losses 336, additional average battery potentials 338, additional charge loss rates 340, additional or updated average charge loss rates 342, and additional differences 344 between the additional average charge loss rates 342 and the additional charge loss rates 340.

Figures 4, 5:
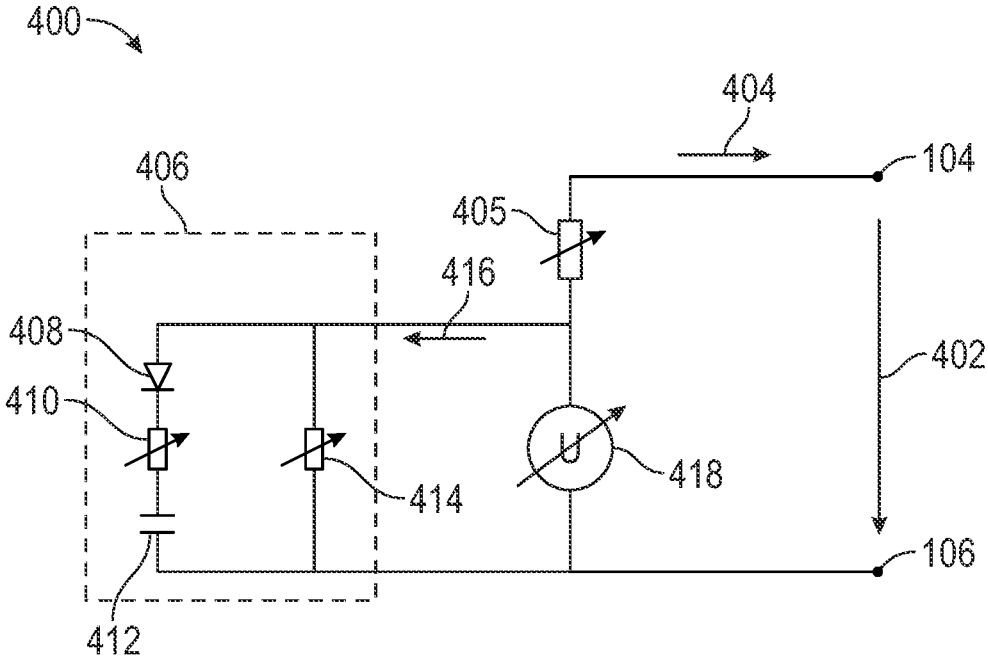
FIG. 4 is a schematic depicting an equivalent circuit for illustrating energy parameters of a lithium-ion battery.
FIG. 5 is a diagram depicting the law of energy conservation as applied to a lithium-ion battery.
Figure 6:
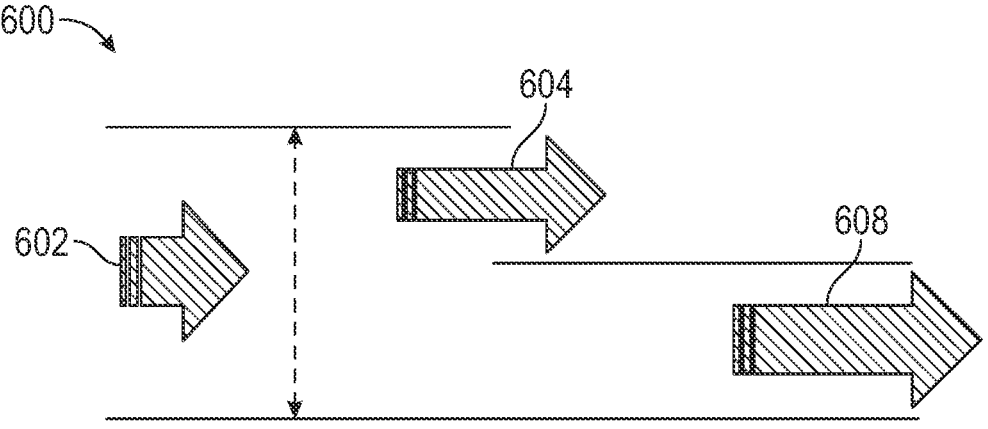
FIG. 6 is a diagram depicting the law of charge conservation as applied to a lithium-ion battery.

The operations described herein with respect to the system 100 may rely on the laws of energy conservation and charge conservation as they relate to rechargeable batteries. FIGS. 4, 5, and 6 may be useful in describing these principles.

Referring to FIG. 4, an equivalent circuit 400 for illustrating energy parameters of a lithium-ion battery (e.g., the battery 102) is depicted. The circuit 400 may include the set of terminals 104, 106. The circuit 400 may exhibit a voltage 402 across the set of terminals 104, 106. Likewise, when connected to an external circuit (e.g., the load or source 128) the circuit 400 may exhibit a current 404. An energy charged into the circuit 400, which is represented mathematically herein as $E_0$, may be determined based on the voltage 402 and the current 404. Likewise, a charge put into the circuit 400, which may be represented mathematically herein as $C_0$, may also be calculated based on the current 404 and time.

The circuit 400 may include a voltage source 418 to represent stored reusable voltage within a lithium-ion battery (e.g., the battery 102). The voltage source 418 may enable the calculation of reusable energy and reusable charge, which may respectively be represented mathematically herein as $E_1$ and $C_1$.

The circuit 400 may further include an internal loss model 406 to represent losses that occur internally within a lithium-ion battery (e.g., the battery 102). These losses may be due to resistive leakage and irreversible process losses. The resistive leakage, with may include self-discharging losses, may be represented by a variable resistor 414. The irreversible process losses, which may include lithium loss, degradation of electrolytes, activation over potential loss, concentration over potential loss, etc., may be represented by a diode 408, a variable resistor 410, and a capacitor 412. These loss elements may result in a loss current 416 within the circuit 400. The internal loss model 406 may enable the calculation of a non-reusable energy loss and a non-reusable electric charge loss, which may be respectively represented mathematically herein as $E_2$ and $C_2$.

The circuit 400 may also include a resistor 405 to represent cell internal resistance due to conductive loss of internal wiring, electrodes, electrolytes, etc. A resistance of the resistor 405 may be represented mathematically herein as R, and may enable calculation of an internal resistive loss during charging and discharging, which may be respectively represented mathematically herein as $E_3$ and $E_4$.

Referring to FIG. 5, a chart 500 depicts the law of conservation of energy as it relates to the circuit 400 of FIG. 4. The energy charged into a battery 502 ($E_0$) is equal to the sum of the reusable energy of the battery 510 ($E_1$), the non-reusable energy loss 508 ($E_2$), the internal resistive loss during discharging 506 ($E_3$), and the internal resistive loss during charging 504 ($E_4$).

Referring to FIG. 6, a chart 600 depicts the law of charge conservation as it relates to the circuit 400 of FIG. 4. The electric charge charged into the battery 602 ($C_0$) equals the sum of the reusable charge 608 ($C_1$), which is the charge that is capable of being discharged, and the electric charge loss due to irreversible processes 604 ($C_2$).

Figure 7:
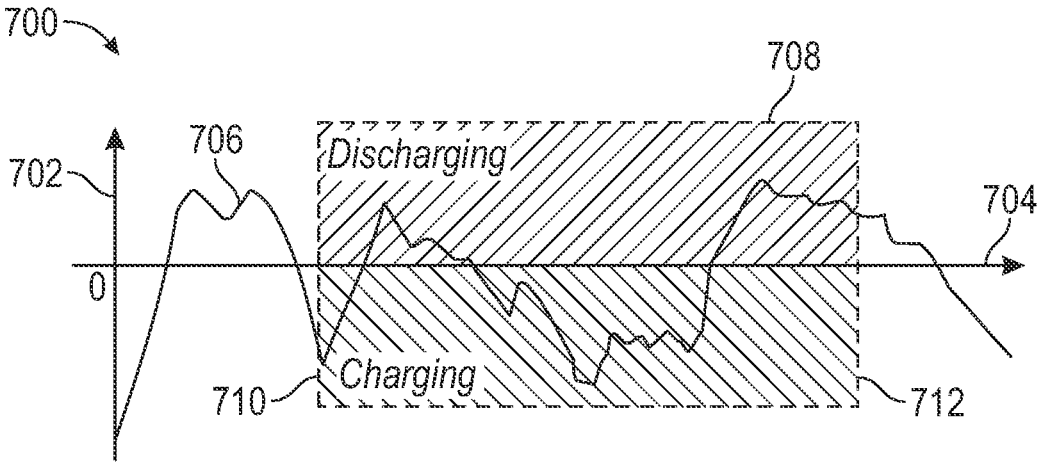
FIG. 7 is a plot depicting a recorded current as a function of time at a set of battery terminals along with a depiction of a time window calculated therefrom.

Referring to FIG. 7, a plot 700 depicts a function 706 representing a current 702 over time 704. The function 706 may be used to determine a time window 708 that enables battery real-time ISC detection.

The time window 708 may correspond to the time window 304 depicted in FIG. 3 and may be enclosed by a beginning time 712 and an ending time 710 (in the order of most recent to earliest). Further, the time window 708 may be selected such that it satisfies at least two criteria. First, during the time window, an accumulated electric charge may be substantially equal to zero. Second, during the time window, an accumulated absolute value of the electric charge may substantially equal a stored comparison value (e.g., the stored comparison value 202). As used herein, the term "substantially equal" means that the differences fall within typical engineering tolerances, when taking into account real-world imperfections in engineered systems. The stored comparison value 202 may affect the length of the time window 708. A higher value may result in a longer interval. In some embodiments, the stored comparison value 202 may be a rated cell capacity value associated with the battery 102. However, other values may be used based on a desired typical time window duration.

Represented mathematically, the time window 708 may be selected such that $$0 = \int_{T_{start}}^{T_{stop}} i \cdot dt, \qquad \text{(Equation 1)}$$

and such that $$C_W = \int_{T_{start}}^{T_{stop}} |i| \cdot dt, \qquad \text{(Equation 2)}$$

where $T_{start}$ is the beginning time 712, $T_{stop}$ is the ending time 710, i is the function 706, and $C_W$ is the stored comparison value 202. The right sides of Equations 1 and 2 may correspond to the accumulated electric charge values 302 depicted in FIG. 3, where the right side of Equation 1 may be an accumulated electric charge, and the right side of Equation 2 may be an accumulated absolute value of the electric charge.

To determine whether a battery ISC exists, an energy loss may be calculated. The energy loss may be calculated based on the law of energy conservation, which for a battery may be expressed as $$E_0 = E_1 + E_2 + E_3 + E_4,$$

where $E_0$ is the energy charged into the circuit 400 depicted in FIG. 4, or in other words $E_0$ may be a magnitude of energy measured at the set of terminals 104, 106 (depicted in FIG. 1) during charging, $E_1$ is the reusable energy of the circuit 400, or in other words $E_1$ may be a magnitude of energy measured at the set of terminals 104, 106 during discharging, $E_2$ is the energy loss, $E_3$ is an internal resistive loss during discharging, and $E_4$ is an internal resistive loss during charging. The terms in the above equation may be substituted with their calculations as follows (noting that $E_3 + E_4$ are combined into a single integral the equation below)

$$\int_{T_{start}}^{T_{stop}} v \cdot |i|_{(i \leq 0)} \cdot dt = \int_{T_{start}}^{T_{stop}} v \cdot |i|_{(i>0)} \cdot dt + E_2 + \int_{T_{start}}^{T_{stop}} i \cdot i \cdot R \cdot dt,$$

where $T_{start}$ is the beginning time 712 of the time window 708 of FIG. 7, $T_{stop}$ is the ending time 710 of the time window 708, v is a function of voltage over time (e.g., the voltage 118 of FIG. 1), i is a function of current over time (e.g., the current 120 of FIG. 1), $E_2$ is the energy loss, and R is an internal resistance of the battery 102 of FIG. 1. R may correspond to the resistance of the battery 206 of FIG. 2. The integrals in the equations above may correspond respectively to the magnitude of energy transferred during charging 306, the magnitude of energy transferred during discharging 308, and the internal resistive energy loss 312 of FIG. 3. $E_2$ may correspond to the energy loss 314 of FIG. 3. The internal resistance R may be determined from a manufacturer specification or from lab testing.

The above equation may be rewritten to solve for the energy loss.

$$E_2 = \int_{T_{start}}^{T_{stop}} v \cdot |i|_{(i \leq 0)} \cdot dt - \int_{T_{start}}^{T_{stop}} v \cdot |i|_{(i > 0)} \cdot dt - \int_{T_{start}}^{T_{stop}} i \cdot i \cdot R \cdot dt. \quad \text{(Equation 3)}$$

Once the energy loss $E_2$ has been determined, a charge loss rate may be calculated. The charge loss rate may be represented mathematically as $$CLR = \frac{E_2}{U_{avg} \cdot (T_{stop} - T_{start})}, \quad \text{(Equation 4)}$$

where CLR is the charge loss rate, $E_2$ is the energy loss, $U_{avg}$ is an average battery potential over the time window 708 of FIG. 7, $T_{start}$ is the beginning time 712 of the time window 708, and $T_{stop}$ is the ending time 710 of the time window 708.

The average battery potential $U_{avg}$ may be represented mathematically as $$U_{avg} = \frac{\int_{T_{start}}^{T_{stop}} (v + i \cdot R) dt}{(T_{stop} - T_{start})}, \quad \text{(Equation 5)}$$

where $U_{avg}$ is the average battery potential, $T_{start}$ is the beginning time 712 of the time window 708, $T_{stop}$ is the ending time 710 of the time window 708, v is a function of voltage over time (e.g., the voltage 118 of FIG. 1), i is a function of current over time (e.g., the current 120 of FIG. 1), and R is an internal resistance of the battery 102 of FIG. 1.

Combining equations 4 and 5 above, the charge loss rate may be represented as $$CLR = \frac{E_2}{\int_{T_{start}}^{T_{stop}} (v + i \cdot R) dt}. \quad \text{(Equation 6)}$$

When the charge loss rate is elevated relative to normal battery operations, an ISC condition may exist. To determine whether the charge loss rate is elevated, it may be compared to an average charge loss rate associated with the battery. When the difference between the two is greater than a threshold, an ISC may be determined to be occurring.

The average charge loss rate may be represented mathematically as $$CLR_{avg} = \frac{1}{M} \sum_{j=1}^{M} |CLR_j|, \quad \text{(Equation 7)}$$

where $CLR_{avg}$ is the average charge loss rate, M is a predetermined number of most recently calculated charge loss rates, and each $CLR_j$ is a distinct calculated charge loss rate CLR. While Equation 7 represents a mean average of previously calculated charge loss rates, other averages (e.g., weighted, median, etc.) are possible.

When a difference between the charge loss rate from Equation 6 and the average charge loss rate from Equation 7 is greater than a threshold value, an ISC condition may exist. This may be represented mathematically as $$|CLR - CLR_{avg}| > \delta, \quad \text{(Equation 8)}$$

where CLR is the charge loss rate, $CLR_{avg}$ is the average charge loss rate, and $\delta$ is the threshold.

Figure 8:
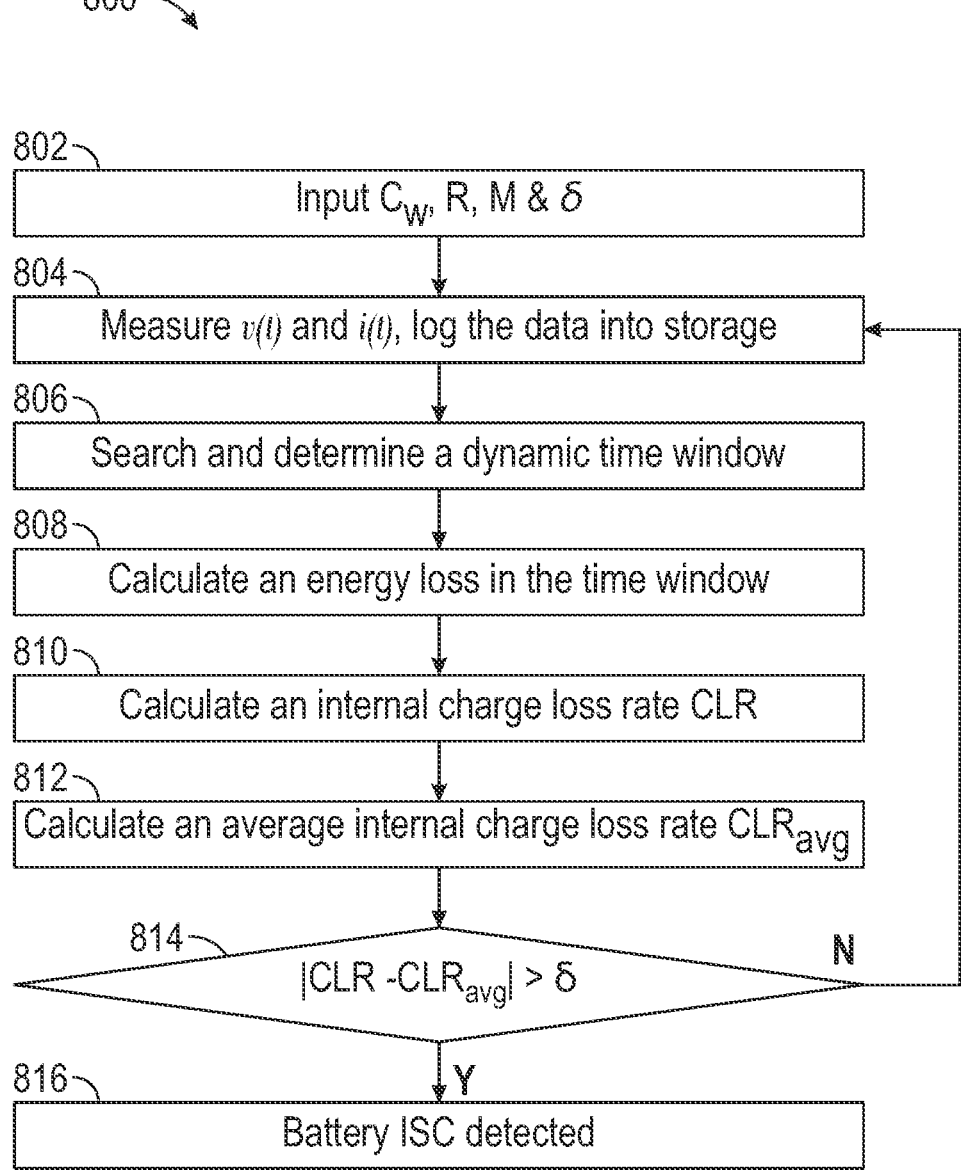
FIG. 8 is a flow chart depicting a battery real-time ISC detection method.

Referring to FIG. 8, the above process for real-time ISC detection may be described in a method 800, which may be performed by the system 100 of FIG. 1. The method 800 may include inputting a comparison value $C_W$, a resistance R, a number of most recent charge loss rates M, and a threshold $\delta$, at 802. For example, $C_W$ may correspond to the comparison value 202, R may correspond to the resistance 206 of the battery 102, M may correspond to the number of most recent charge loss rates 204, and $\delta$ may correspond to the threshold value 208. These values may be predetermined either by being input by a user of the system 100, by storage in the memory 114, or both.

The method 800 may further include measuring a voltage as a function of time and a current as a function of time and logging the data into storage, at 804. For example, the processor 108 may continuously record, at the set of terminals 104, 106, the voltage 118 as a function of time and the current 120 as a function of time, which may be stored in the memory 114.

The method 800 may also include searching and determining a dynamic time window, at 806. For example, the processor 108 may determine the time window 304 (and/or the time window 708) based on the current 120 as a function of time. During the time window 304, an accumulated electric charge (which may be one of the accumulated electric charge values 302) may be substantially zero and an accumulated absolute value of the electric charge (which may be another of the accumulated electric charge values 302) may substantially equal the stored comparison value $(C_W)$ 202. In some cases, the stored comparison value $(C_W)$ 202 may be a rated cell capacity value associated with the battery. However, other values may be used. These criteria may be represented as Equations 1 and 2 herein.

The method 800 may include calculating an energy loss in the time window, at 808. For example, the processor 108 may be configured to calculate a magnitude of energy transferred during charging 306 at the set of terminals 104, 106 during the time window 304 during charging of the battery 102. The processor 108 may be further configured to calculate the magnitude of energy transferred during discharging 308 at the set of terminals 104, 106 during the time window 304 during discharging of the battery 102. The processor 108 may also be configured to calculate the internal resistive energy loss 312 at the set of terminals 104, 106 during the time window 304 based on the predetermined resistance (R) 206 of the battery 102. The energy loss 314 of the battery 102 within the time window 304 may be substantially equal to a difference between the magnitude of the calculated energy transferred during charging 306 of the battery 102 and a combination of the magnitude of the energy transferred during discharging 308 of the battery 102 and the internal resistive energy loss 312. The predetermined resistance (R) 206 of the battery 102 may be determined from a manufacturer specification or from lab testing. These calculations may be represented as Equation 3 herein.

The method 800 may further include calculating an internal charge loss rate, at 810. For example, the processor 108 may calculate the average battery potential 316. The charge loss rate 318 of the battery 102 may be substantially equal to the energy loss 314 of the battery 102 divided by a product of the average battery potential 316 and a duration of the time window, which can be determined by finding a difference between the beginning time 712 and the ending time 710 of the time window 708. These calculations may be represented as Equation 6 herein.

The method 800 may also include calculating an average internal charge loss rate, at 812. For example, the average charge loss rate 320 may be calculated as a mean average of the predetermined number (M) 204 of most recently calculated charge loss rates. These calculations may be represented by Equation 7 herein. As the additional charge loss rates 340 are calculated, the processor 108 may continually update the average charge loss rate 320. Or in other words, the processor 108 may calculate the additional average charge loss rates 342.

The method 800 may include comparing a difference between the internal charge loss rate and the average internal charge loss rate to a threshold value, at 814. For example, the processor 108 may be configured to calculate a difference between the charge loss rate 318 of the battery 102 and the average charge loss rate 320 of the battery 102. The processor 108 may then determine whether the difference is greater than the predetermined threshold value S 208. These calculations may be represented as Equation 8 herein.

The method 800 may further include, while the difference is not greater than the threshold value, repeating the method 800, at 804-814. For example, the processor 108 may continually repeat determining the additional time windows 326 based on the current 120. The processor 108 may further continually repeat calculating the additional energy losses 336 of the battery 102 within the additional time windows 326. The processor may also continually repeat calculating the additional charge loss rates 340 of the battery 102 within the additional time windows 326. Finally, the processor 108 may continually repeat determining whether the ISC exists by comparing the additional charge loss rates 340 of the battery to the average charge loss rate 320 (or the additional or updated charge loss rates 342) of the battery.

The method 800 may include, in response to the difference being greater than the threshold value, determining that a battery ISC is detected, at 816. For example, the indication 126 may be generated to provide an alert that an ISC condition exists. Further, in response to determining that a battery ISC is detected, mitigation steps may be taken at the battery 102, which may include initiating an automatic shutdown of battery operations associated with the battery 102.

It should be noted that the embodiments herein are described in terms of continuous functions and integration of those functions (e.g., ∫f(x)). However, because the described embodiments may measure data in discrete time periods, the disclosure and claims should be interpreted as equally applicable to discrete functions and sums of those functions (e.g., Σf[n]). In other words, as used herein, continuous functions and continuous function operations should be understood to be used interchangeably with their counterpart discrete functions and discrete function operations (i.e., ∫f(x) is used interchangeably with Σf[n]).

Although various embodiments have been shown and described, the present disclosure is not so limited and will be understood to include all such modifications and variations as would be apparent to one skilled in the art.

What is claimed is:

1. A system comprising:

a battery having a set of terminals;

one or more processing elements configured to:

continuously record, at the set of terminals, a voltage as a function of time and a current as a function of time;

determine a time window based on the current as a function of time, wherein, during the time window, an accumulated electric charge is substantially zero, and wherein, during the time window, an accumulated absolute value of the electric charge substantially equals a stored comparison value;

calculate an energy loss of the battery within the time window;

calculate a charge loss rate of the battery within the time window based at least partially on the energy loss of the battery within the time window;

determine whether an internal short circuit exists within the battery based on the charge loss rate and a predetermined threshold value; and in response to determining that the internal short circuit exists, generate an indication that the internal short circuit exists.

2. The system of claim 1, wherein the one or more processing elements are further configured to initiate an automatic shutdown of battery operations associated with the battery, transfer a load to another battery, or both, in response to the indication that the internal short circuit exists.

3. The system of claim 1, wherein the one or more processing elements are further configured to:

continually repeat determining additional time windows based on the current as a function of time;

continually repeat calculating additional energy losses of the battery within the additional time windows;

continually repeat calculating additional charge loss rates of the battery within the additional time windows; and continually repeat determining whether the internal short circuit exists based on the additional charge loss rates of the battery and the predetermined threshold value.

4. The system of claim 3, wherein the one or more processing elements are further configured to continually update an average charge loss rate of the battery based on a predetermined number of most recently calculated additional charge loss rates.

5. The system of claim 1, wherein the stored comparison value is a rated cell capacity value associated with the battery.

6. The system of claim 1, wherein, as part of calculating the energy loss of the battery within the time window, the one or more processing elements are configured to:

calculate a magnitude of energy transferred at the set of terminals during the time window during charging of the battery;

calculate a magnitude of energy transferred at the set of terminals during the time window during discharging of the battery; and calculate an internal resistive energy loss at the set of terminals during the time window based on a predetermined resistance of the battery, wherein the energy loss of the battery within the time window is substantially equal to a difference between the magnitude of the calculated energy transferred during charging of the battery and a combination of the magnitude of the energy transferred during discharging of the battery and the internal resistive energy loss.

7. The system of claim 6, wherein the predetermined resistance of the battery is determined from a manufacturer specification or from lab testing.

8. The system of claim 1, wherein as part of calculating the charge loss rate of the battery within the time window, the one or more processing elements are configured to calculate an average battery potential during the time window, wherein the charge loss rate of the battery is substantially equal to the energy loss of the battery within the time window divided by a product of the average battery potential during the time window and a duration of the time window.

9. The system of claim 1, wherein as part of determining whether an internal short circuit exists, the one or more processing elements are configured to:

calculate an average charge loss rate of the battery based on a predetermined number of most recently calculated charge loss rates;

calculate a difference between the charge loss rate of the battery and the average charge loss rate of the battery; and determine whether the difference is greater than the predetermined threshold value.

10. The system of claim 1, wherein the battery and the one or more processing elements are incorporated into an aircraft.

11. A system comprising a processor and memory, wherein the memory stores instructions that, when executed by the processor, cause the processor to:

continuously record, at a set of terminals of a battery, a voltage as a function of time and a current as a function of time;

determine a time window based on the current as a function of time by select a beginning time $T_{start}$ of the time window and an ending time $T_{stop}$ of the time window that substantially satisfy the equations $$0 = \int_{T_{start}}^{T_{stop}} i \cdot dt$$

and $$C_W = \int_{T_{start}}^{T_{stop}} |i| \cdot dt,$$

wherein i is the current as a function time and wherein $C_W$ is a stored comparison value;

calculate an energy loss of the battery within the time window;

calculate a charge loss rate of the battery within the time window based at least partially on the energy loss of the battery within the time window;

determine whether an internal short circuit exists within the battery based on the charge loss rate of the battery and a predetermined threshold value; and in response to determining that the internal short circuit exists, generate an indication that an internal short circuit exists.

12. The system of claim 11, wherein the energy loss of the battery within the time window substantially satisfies the equation $$E_2 = \int_{T_{start}}^{T_{stop}} v \cdot |i|_{(i\leq 0)} \cdot dt - \int_{T_{start}}^{T_{stop}} v \cdot |i|_{(i>0)} \cdot dt - \int_{T_{start}}^{T_{stop}} i \cdot i \cdot R \cdot dt,$$

14 wherein $E_2$ is the calculated energy loss of the battery, v is the voltage as a function of time, and R is a predetermined resistance of the battery.

13. The system of claim 11, wherein the charge loss rate of the battery within the time window substantially satisfies the equation $$CLR = \frac{E_2}{\int_{T_{start}}^{T_{stop}} (v + i \cdot R) dt},$$

wherein CLR is the charge loss rate of the battery within the time window, $E_2$ is the calculated energy loss of the battery, v is the voltage as a function of time, and R is a predetermined resistance of the battery.

14. A method comprising:

continuously recording, at a set of terminals of a battery, a voltage as a function of time and a current as a function of time;

determining a time window based on the current as a function of time, wherein, during the time window, an accumulated electric charge is substantially zero, and wherein, during the time window, an accumulated absolute value of the electric charge substantially equals a stored comparison value;

calculating an energy loss of the battery within the time window;

calculating a charge loss rate of the battery within the time window based at least partially on the energy loss of the battery within the time window;

determining whether an internal short circuit exists within the battery based on the charge loss rate of the battery and a predetermined threshold value; and generating an indication that the internal short circuit exists.

15. The method of claim 14, further comprising initiating an automatic shutdown of battery operations associated with the battery, transfer a load to another battery, or both, in response to the indication that the internal short circuit exists.

16. The method of claim 14, further comprising:

determining additional time windows based on the current as a function of time;

calculating additional energy losses of the battery within the additional time windows;

calculating additional charge loss rates of the battery within the additional time windows; and determining whether the internal short circuit exists based on the additional charge loss rates of the battery and the predetermined threshold value.

17. The method of claim 14, further comprising:

calculating a magnitude of energy transferred at the set of terminals during the time window during charging of the battery;

calculating a magnitude of energy transferred at the set of terminals during the time window during discharging of the battery; and calculating an internal resistive energy loss at the set of terminals during the time window based on a predetermined resistance of the battery, wherein the energy loss of the battery within the time window is substantially equal to a difference between the magnitude of the calculated energy transferred during charging of the battery and a combination of the magnitude of the energy transferred during discharging of the battery and the internal resistive energy loss.

18. The method of claim 17, further comprising determining the predetermined resistance of the battery by measurement.

19. The method of claim 14, further comprising calculating an average battery potential during the time window, wherein the charge loss rate of the battery is substantially equal to the energy loss of the battery within the time window divided by a product of the average battery potential during the time window and a duration of the time window.

20. The method of claim 14, further comprising:

calculating a difference between the charge loss rate of the battery and an average charge loss rate of the battery; and determining whether the difference is greater than a predetermined threshold value.

* * * * *